(12) United States Patent
Dhinojwala et al.

(10) Patent No.: US 9,670,060 B2
(45) Date of Patent: Jun. 6, 2017

(54) HYDROPHOBIC SURFACE COATING SYSTEMS AND METHODS FOR METALS

(75) Inventors: Ali Dhinojwala, Akron, OH (US); Sunny Sethi, Akron, OH (US)

(73) Assignee: The University of Akron, Akron, OH (US)

( * ) Notice: Subject to any disclaimer, the term of this patent is extended or adjusted under 35 U.S.C. 154(b) by 721 days.

(21) Appl. No.: 13/128,288

(22) PCT Filed: Nov. 13, 2009

(86) PCT No.: PCT/US2009/064296
§ 371 (c)(1),
(2), (4) Date: May 9, 2011

(87) PCT Pub. No.: WO2010/056933
PCT Pub. Date: May 20, 2010

(65) Prior Publication Data
US 2011/0212297 A1    Sep. 1, 2011

Related U.S. Application Data

(60) Provisional application No. 61/114,482, filed on Nov. 14, 2008.

(51) Int. Cl.
*D06N 7/04*    (2006.01)
*B32B 9/00*    (2006.01)
(Continued)

(52) U.S. Cl.
CPC ...... *B81C 1/00206* (2013.01); *B81C 1/00111* (2013.01); *B82Y 30/00* (2013.01);
(Continued)

(58) Field of Classification Search
None
See application file for complete search history.

(56) References Cited

U.S. PATENT DOCUMENTS 3,535,146 A * 10/1970 Flicker .......................... 428/557
4,125,646 A * 11/1978 Dean et al. ................... 427/253
(Continued)

FOREIGN PATENT DOCUMENTS

JP    2007-536101    12/2007
WO   WO 2005/044723 A2 *   5/2005
(Continued)

OTHER PUBLICATIONS

Masarapu et al., Langmuir, 2007, vol. 23, pp. 9046.*
(Continued)

*Primary Examiner* — David Sample
*Assistant Examiner* — Nicole T Gugliotta
(74) *Attorney, Agent, or Firm* — Renner Kenner Greive Bobak Taylor & Weber

(57) ABSTRACT

This is provided a hydrophobic or superhydrophobic surface configuration and method of forming a hydrophobic or superhydrophobic material on a metallic substrate. The surface configuration comprises a metallic substrate having a carbon nanotube/carbon fibers configuration grown thereon, with the carbon nanotubes/carbon fibers configuration having a heirarchial structure formed to have a predetermined roughness in association with the surface. The method comprises providing a metallic substrate having a predetermined configuration, and growing a plurality of carbon nanotubes/fibers or other nanostructures formed into a predetermined architecture supported on the substrate.

8 Claims, 16 Drawing Sheets

(51) Int. Cl.
*D01F 9/12* (2006.01)
*B81C 1/00* (2006.01)
*C09J 7/00* (2006.01)
*C01B 31/02* (2006.01)
*B82Y 30/00* (2011.01)
*B82Y 40/00* (2011.01)

(52) U.S. Cl.
CPC .......... *B82Y 40/00* (2013.01); *C01B 31/0226* (2013.01); *C09J 7/00* (2013.01); *B81C 2201/0191* (2013.01); *C09J 2201/626* (2013.01); *Y10T 156/109* (2015.01); *Y10T 428/24008* (2015.01); *Y10T 428/24364* (2015.01); *Y10T 428/24893* (2015.01); *Y10T 428/249921* (2015.04); *Y10T 428/25* (2015.01); *Y10T 428/26* (2015.01); *Y10T 428/29* (2015.01); *Y10T 428/298* (2015.01); *Y10T 428/2913* (2015.01); *Y10T 428/30* (2015.01); *Y10T 442/2213* (2015.04); *Y10T 442/2221* (2015.04)

(56) References Cited

U.S. PATENT DOCUMENTS

| | | | |
|---|---|---|---|
| 7,901,775 B2* | 3/2011 | Miyamoto | 428/408 |
| 7,927,666 B2 | 4/2011 | Ajayan et al. | |
| 8,764,914 B2* | 7/2014 | Gunsalus et al. | 148/28 |
| 9,520,258 B2* | 12/2016 | Oye | H01J 9/025 |
| 2002/0024279 A1 | 2/2002 | Simpson et al. | |
| 2003/0165418 A1 | 9/2003 | Ajayan et al. | |
| 2004/0058153 A1 | 3/2004 | Ren et al. | |
| 2006/0068195 A1 | 3/2006 | Majumdar et al. | |
| 2006/0073332 A1 | 4/2006 | Huang et al. | |
| 2006/0078725 A1 | 4/2006 | Fearing et al. | |
| 2008/0280137 A1 | 11/2008 | Ajayan et al. | |
| 2008/0292840 A1 | 11/2008 | Majumdar et al. | |
| 2009/0269560 A1 | 10/2009 | Dhinojwala | |
| 2012/0034150 A1* | 2/2012 | Noyes | B82Y 30/00 423/447.2 |
| 2013/0130383 A1* | 5/2013 | Mukhopadhyay | C09D 5/00 435/395 |
| 2013/0233348 A1* | 9/2013 | O'Riorden | B08B 7/0028 134/6 |

FOREIGN PATENT DOCUMENTS

| | | |
|---|---|---|
| WO | 2008115640 | 9/2008 |
| WO | 2010056933 | 5/2010 |

OTHER PUBLICATIONS

Lau et al., Nano Letters, 2003, vol. 3, No. 12, pp. 1701-1705.*
Feng et al., "Super-Hydrophobic Surfaces: From Natural to Artificial," Dec. 17, 2002, Advanced Materials, Issue 14, No. 24.*
Cambridge Online Dictionary definition of "mesh." Copyright 2014. http://dictionary.cambridge.org/us/dictionary/american-english/mesh.*
Masarapu, C. et al., "Direct Growth of Aligned Multiwalled Carbon Nanotubes on Treated Stainless Steel Substrates," Am. Chem Society, 2007, pp. 9046-9049, vol. 23, Newark, NJ.
Lau, K et al., "Superhydrophobic Carbon Nanotube Forests," Nano Letters, 2003 pp. 1701-1705, vol. 3, No. 12, Cambridge, MA.
Zhu, H et al., "Direct fabrication of single-walled carbon nanotube macro-films on flexible substrates," Chemical Communication, The Royal Society of Chemistry, 2007, 3042-3044.
Jung, YJ, "Aligned Nanotube-Polymer Hybrid Architectures for Diverse Flexible Electronic Applications," Nano Letters, 2006, pp. 413-418, vol. 6 No. 3, Cambridge, MA.
Yurdumakan et al., "Synthetic Gecko Foot-Hairs from Multiwalled Carbon Nanotubes," Chemical Communication, The Royal Society of Chemistry, 2005, pp. 3799-3801.
Suhr, J et al, "Temperature-Activated Interfacial Friction Damping in Carbon Nanotube Polymer-Composites," Nano Letters, 2006 pp. 219-223, vol. 6, No. 2.
Li, X et al, "Bottom-Up Growth of Carbon Nanotube Multilayers: Unprecedented Growth," Nano Letters, 2005, pp. 1997-2000, vol. 5, No. 10.
Cao, A et al., "Super-Compressible Foamlike Carbon Nanotube Films," Science, Nov. 2005, pp. 1307-1310, vol. 310.
Zhang, ZJ et al., "Substrate-Site Selective Growth of Aligned Carbon Nanotubes," Applied Physics Letters, Dec. 2000, pp. 3764-3766, vol. 77, No. 23.
Zhao, Y et al., "Interfacial Energy and Strength of Multiwalled-Carbon-Nanotube-Based Dry Adhesive," Vac. Sci. Technol., B 24(1), Jan./Feb. 2006, American Vacuum Society, pp. 331-335.
Lin Feng, et al., Super-Hydrophobic Surfaces: From Natural to Artificial; 2002 Wiley-VCH Verlag GmbH & Co. KGaA, Weinheim; Advanced Mater 2002, 14, No. 24, Dec. 17, 2 pages.
International Application No. PCT/US2008/054061 International Search Report/Written Opinion, Jan. 29, 2009, 10 pages.
Chia, Y.L. et al., "Characteristics and Electrochemical Performance of Supercapacitors with Manganese Oxide-Carbon Nanotube Nanocomposite Electrodes," Journal of the Electrochemical Society, 2005, vol. 152, Issue 4, pp. A716-A720.

* cited by examiner

Fig. 7A
Fig. 7B
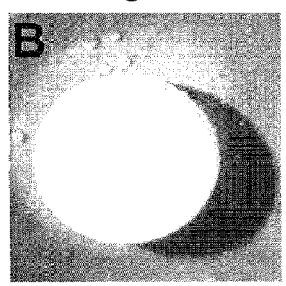
Fig. 7C
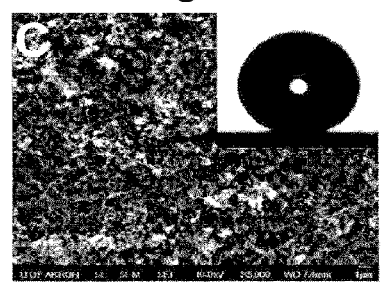
Fig. 7E

HYDROPHOBIC SURFACE COATING SYSTEMS AND METHODS FOR METALS

CROSS-REFERENCE TO RELATED APPLICATION

This is a national stage application of PCT/US09/64296, filed Nov. 13, 2009, to which this application claims priority from and any other benefit of U.S. Provisional Application No. 61/114,482 filed Nov. 14, 2008, the entire disclosure of which is hereby incorporated by reference.

FIELD OF INVENTION

The invention relates to systems and methods of making and using the systems, wherein the systems and methods relate to having or forming hydrophobic and superhydrophobic surface layers on metal materials. The hydrophobic or superhydrophobic surface layer is formed to have a morphology of non-uniformly distributed carbon structures like carbon nanotubes and carbon fibers grown on the metal surface in a predetermined manner. The systems provide thermal stability and electrical conductivity that allow use in a variety of environments and applications. This hydrophobic surface layer may be formed over in a non-uniform layer(s), which allows the hydrophobic layer to have a desired roughness (i.e. morphology) that simulates a lotus like structure on a metal surface, with strong water repellency and self-cleaning characteristics. The fields that the invention is related to include fluid mechanics, machines and systems involving flowing liquids, liquid transportation, floating devices, electrical and electronic equipment, anti-fouling surfaces, ice growth retardant material and other applications.

BACKGROUND OF THE INVENTION

In a variety of applications, the ability to shed water or other contaminants is important, and there have been developed hydrophobic surfaces designed to reduce friction to the flow or retention of water or other liquid on the surface. Hydrophobic materials have surfaces that are difficult to wet with water or ice, with water contact angles generally in excess of 120°. Superhydrophobic surfaces generally have contact angles of 150° or more. Hydrophobic materials are characterized by Cassie's law which describes the effective contact angle $\theta_c$ for a liquid on the surface. Cassie's law explains how roughing up a surface increases the apparent surface angle between a liquid and the surface. The surface energy of the hydrophobic surface is directly related to its ability to repel water. As surface energy decreases water droplets have increased preference to cling to themselves as opposed to the surface. It has been found that the external surfaces of many plants and animals have a rough surface structure combined with an ideal surface chemistry to create self-cleaning, water-repellant surfaces. For example, the self-cleaning characteristics found on the leaf surface of the *N. nucifera* (the white lotus) and the wing surface of many insects combine a topology describing a high degree of surface roughness with a chemistry that exhibits=low surface energy thus creating a superhydrophobic surface such that it sheds liquids of various types allowing particulates to be removed when subjected to an external force such as rolling water droplet, or flowing air. Superhydrophobic coatings utilizing nano sized irregularities applied to a surface form a high contact angle which resist wetting and adherence of dirt and contaminants.

For example, in association with structures such as aircraft or aerospace exterior surfaces, the surfaces of heat exchange equipment, and many others, are susceptible to the buildup of ice, water, and other contaminants that can interfere with the operation of such surfaces or reduce their efficiency. For example, the buildup of ice, water, and/or other contaminants on aircraft wings, propellers, rotors, and other functional surfaces can interfere with or degrade the operating performance of the aircraft, heat exchanger equipment or the like. When such buildups occur, much time and cost can be expended in the removal thereof. To prevent or mitigate such buildup, hydrophobic surfaces, which tend to repel water, may be utilized.

In other applications, such as water or other liquid transport conduits, microfluidic devices or the like, resistance to flow of the liquid can be imposed by the surfaces. The main physical barrier limiting the effectiveness and velocity of transportation of liquids and in liquids lies in the fact that the fluid or systems operating in fluids have to overcome significant resistance accompanying the movement of the systems relative to the fluid or the movement of liquids transported through pipelines. The aero- and hydrodynamic resistance increases in proportion to the cube of relative velocity of the object and the fluid. One of the many ways proposed to reduce flow resistance of liquids is intentional modification of physicochemical and geometric properties of surfaces in contact with a flowing liquid.

There are also natural organisms, like water striders that, utilize surface tension to walk on the surface of water. Water striders for example, have long thin legs which show water contact angles of around 167°, allowing them to stand on the surface of water using surface tension forces alone. The amount of weight that surface tension can support before the object penetrates the surface is proportional to the perimeter of material. There have been attempts to mimic the behavior of water striders by making objects fitted with long thin wires coated with hydrophobic material like fluorine compounds. Even though using such materials enabled the synthesis of systems which could stay statically on surface of water, the method lacked miniaturization due to the use of long wires to increase the perimeter. It would be desirable to provide the ability to produce miniature floating devices. Such devices may need forces beyond the realm of buoyancy to hold them on the surface of water. Conventional devices, utilizing buoyant force require displacement of water mass equivalent to the mass of the floating object. Such a system may fail if the density of the object is greater than that of water. Surface tension forces may be utilized in such cases. These forces depend on hydrophobicity of material. Hydrophobic surfaces resist penetrating the surface of water. The amount of resistance offered to penetration depends on hydrophobicity of the material.

Attempts have been made to reduce the fluid friction resistance accompanying relative movement of a liquid or fluid relative to a solid surface. Attempts have been made to produce hydrophobic surfaces which repel water or other liquids very effectively. Hydrophobic surfaces (e.g. ultrahydrophobic surfaces and superhydrophobic surfaces) are used in many technological applications. Hydrophobic surfaces can reduce and/or minimize frictional drag in water, minimize corrosion of an underlying material, and serve as self-cleaning surfaces. Some hydrophobic surfaces (e.g. ultra-hydrophobic surfaces and superhydrophobic surfaces) have surface energy attributes and/or morphology attributes (e.g. fine surface roughness) that provide for relatively strong water repellency. However, adequate morphology attributes are difficult and costly to produce, and can be difficult, impractical, and/or impossible to implement on a large scale. Known hydrophobic surface configurations also are either impractical and/or impossible to implement in some desirable applications.

Such attempts have used organic materials such as polymeric materials wherein techniques such as etching, sputtering, lithographic techniques, film deposition from solution, electrolytic deposition or other techniques. While such methods have shown capability for creating a rough surface on particular materials, the methods are fairly limited in application and also require expensive and complicated processing techniques. Further, such attempts have not been useful for many applications, as the organic materials used do not have sufficient thermal stability, electrical conductivity or other attributes desired for many applications. It would be desirable to provide a hydrophobic or superhydrophobic surface configurations and methods which overcome such limitations.

Thus, there exists a need for improved hydrophobic or superhydrophobic surfaces or surface coatings, and techniques of forming hydrophobic or superhydrophobic surfaces, where the hydrophobic characteristics of the surface have a long life span, and the surfaces or coatings can be formed in a repeatable and cost effective manner, particularly in association with metallic surfaces and materials.

SUMMARY OF THE INVENTION

An embodiment of the present invention provides a hydrophobic or superhydrophobic surface configuration and method of forming a hydrophobic or superhydrophobic material on a metallic substrate. A metallic substrate may include a substrate having a coating of a metallic material thereon. The surface configuration comprises a metallic substrate having a carbon nanotube/carbon fibers configuration grown thereon, with the carbon nanotubes/carbon fibers configuration having a heirarchial structure formed to have a predetermined roughness in association with the surface. The method comprises providing a metallic substrate having a predetermined configuration, and growing a plurality of carbon nanotubes/fibers or other nanostructures formed into a predetermined architecture supported on the substrate. The term "hydrophobic surface" refers to a surface that has a water contact angle of approximately 90° or more. A hydrophobic surface is described as having a small hysteresis between advancing and receding contact angles. Moreover, the term "superhydrophobicity" or a "superhydrophobic surface" refers to a surface having a water contact angle of approximately 150° or more. It is preferable to have as low hysteresis in contact angle as possible.

The predetermined architecture formed on the substrate in a manner to attach the predetermined nanotube/fiber architecture to the metallic surface with an aspect ratio which enables the nanotubes/fibers to remain attached when exposed to external forces. The step of providing the plurality of carbon nanotubes/fibers may further design the nanotubes/fibers to have a substantially predetermined width and length, as well as defining at least one orientation for a plurality of nanotubes/fibers. The spacing between nanotubes/fibers and/or groups of nanotubes/fibers may also be controlled. The carbon nanotube/fiber architecture is attached to the metallic surface in a manner that the architecture is stabilized.

The embodiments of the invention provide advantages including the ability to produce a superhydrophobic surface configuration on metallic materials in a manner that that is repeatable. The superhydrophobic qualities in association with the metallic material increases the surface life of the metallic material and associated structure in which the metallic material is used, with the formation of the hydrophobic surface provided in a cost-effective and simplified manner, resulting in reducing maintenance and/or operating costs associated with the metallic material, and providing unique applications. This provides a simple, quick, inexpensive, and easy technique of gaining desired performance characteristics of metallic components and structures.

The hydrophobic surface configurations are obtained by growing nanostructures on a treated metallic surface substrate to produce a predetermined nanometric-sized disconformities. The predetermined disconformities of the metallic surface is controlled to confer predetermined hydrophobic properties that provide characteristics of water-repellency, self-cleaning and/or anti-condensation properties. The hydrophobic character of a surface formed on a metallic surface substrate according to the invention is provided by the microroughness formed on the surface via the nanotubes structure provides low surface wetability and self-cleaning characteristics. The production of the nanotube structures may be performed at a high temperature as the metallic substrate is usable in higher temperature environments, and due to the characteristics of the metallic substrate and nanotubes structures, enables use of the hydrophobic materials in both high and low temperature environments without destruction of coatings.

The present invention proposes materials and methods for producing of materials having surfaces that are superhydrophobic, while overcoming the limitations and drawbacks of the prior art methods. The present invention also relates to a products and systems incorporating the hydrophobic materials, such as in electronic, optical and structural applications. The invention further provides the ability to form miniature metallic devices having one or more surfaces using superhydrophobic carbon nanotube structures which enable them to support much higher mass than what buoyant force corresponding to their volume would have supported.

Other features, benefits and advantages of the invention will become apparent from the following description of the invention, when viewed in accordance with the attached drawings and appended claims.

BRIEF DESCRIPTION OF THE DRAWINGS

For a more complete understanding of this invention, reference should now be made to embodiments illustrated in greater detail in the accompanying figures and described below by way of examples of the invention wherein:

FIG. 7A shows an optical image of an ice droplet on a surface formed according to the invention.

FIG. 7B shows a SEM view of a metallic substrate having the carbon nanotube structures formed thereon after boiling in water and quenching in ice, and an inset view of the hydrophobic characteristics of the surface according to the invention thereafter.

FIG. 7C shows an optical image of maximum water displacement of a modified steel plate according to an example.

FIG. 7E shows an optical image of a floating steel plate according to an example of the invention.

DETAILED DESCRIPTION OF THE INVENTION

Figure 1:
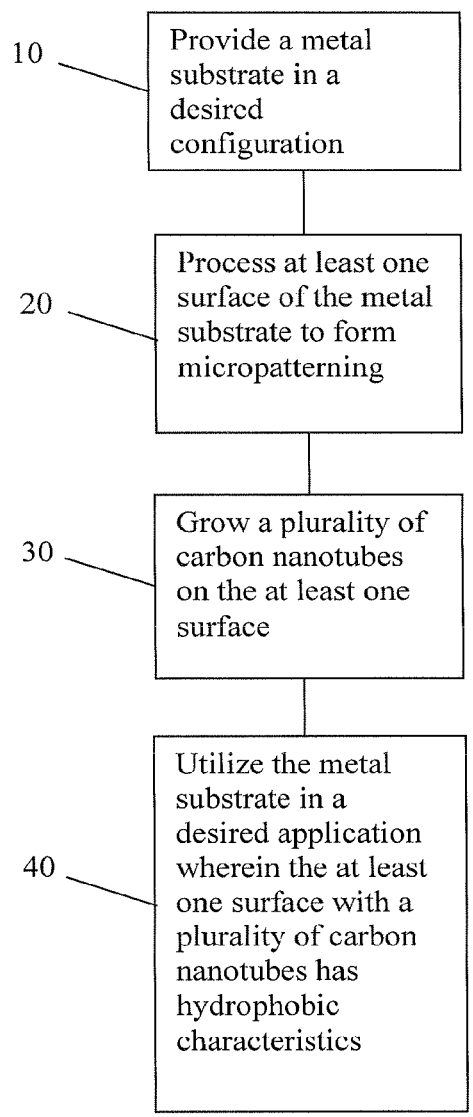
FIG. 1 is a logic flow diagram illustrating a method of forming a superhydrophobic material in accordance with an embodiment of the present invention.

In the figures, the same reference numerals may be used to refer to the same or similar components. While the present invention is described primarily with respect to the formation of superhydrophobic materials and surfaces, these materials and surfaces may be adapted and applied in various applications, some of which will be described herein, but it should be understood that other applications are contemplated and within the scope of the invention.

In the invention, the superhydrophobic materials are formed on metallic surfaces and substrates to provide a substrate system which is used in a variety of applications where a substrate having metallic material physical, structural, electrical, conductive, high or low temperature or other characteristics are desired. Many metals in general have electric and thermal conductivity characteristics, high density and the ability to be deformed under stress without cleaving, that make them useful for various environments and applications. Metal alloys are a mixture of two or more elements in solid solution in which the major component is a metal. Many times, pure metals are can be too soft, brittle or chemically reactive for desired applications, and combining different ratios of metals as alloys modifies the properties of pure metals to produce desirable characteristics. The aim of making alloys is generally to make them less brittle, harder, resistant to corrosion, or to have other characteristics. Examples of alloys are steel such as stainless steel, brass, bronze, duraluminum, which are useful for various applications. Some metals and metal alloys possess high structural strength per unit mass, making them useful materials for carrying large loads or resisting impact damage. Metal alloys can be engineered to have high resistance to shear, torque and deformation. The strength and resilience of metals has led to their frequent use in structures, vehicles, many appliances including heating/cooling equipment, tools, pipes, and many other applications. Metals are good conductors, making them valuable in electrical equipment and for carrying an electric current over a distance with little energy loss. The thermal conductivity of metal makes it useful for various high or low temperature applications. Some metal alloys may have shape memory characteristics useful for applications such as pipes and vascular stents or other medical applications.

In accordance with the invention and with reference to FIG. 1, a metal substrate is provided at 10 and is processed to form micropatterning on at least one surface at 20. In an example, the micropatterning may provide a plurality of disconformities, such as peaks and valleys, on the metal surface. The processing to form micropatterning may be performed as an acid treatment of the metal surface which forms a complex micro- and nanoscopic architecture on the surface. The surface then has a plurality of carbon nanotubes grown on the surface at 30. The formation of a plurality of carbon nanotubes on the at least one surface may be provided by chemical vapor deposition techniques for example. The characteristics of the carbon nanotubes may be controlled by factors such as growth temperature and the nature of the metal surface and catalyst nanoparticles on the surface. The growth of carbon nanotubes may be directly on metal substrate or in association with a suitable catalyst layer provided on the surface. The growth of the nanotubes may be controlled, to form a predetermined size, density, diameter, length, and single versus multiwalled nature of carbon nanotubes. By controlling temperature at which growth is taking place, the diameter of carbon nanotubes grown can be selectively modified and controlled. Different processes can also be used for growing carbon structures on steel, such as by using acetylene as a carbon source and iron in steel as catalyst, or other suitable carbon sources and catalysts.

Figure 2:
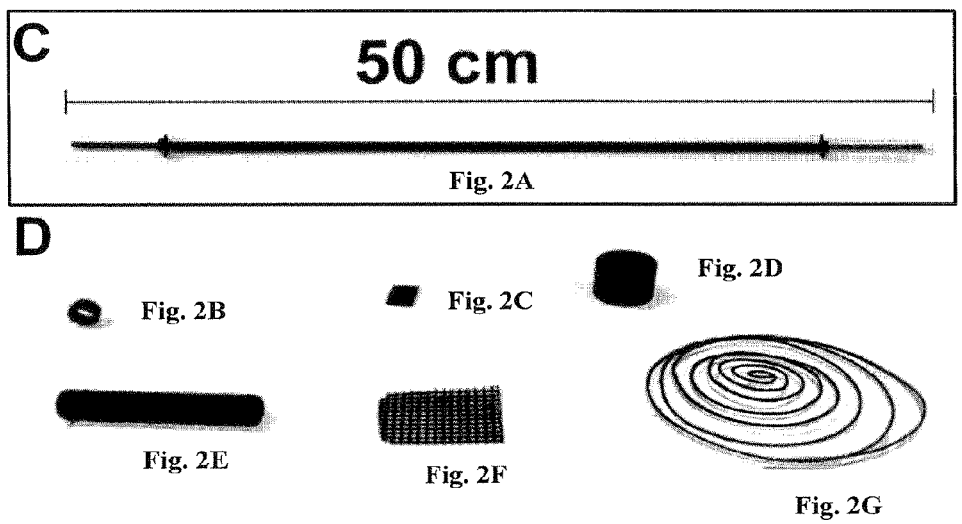
FIGS. 2A-2G shown different metallic substrate geometries usable in the invention.

The metal substrate is then utilized in a desired application wherein the at least one surface with a plurality of nanotubes has hydrophobic characteristics at 40. Due to the characteristics of both the metallic substrate and carbon nanotubes structures, the present invention provides a cost effective and efficient system and method for the formation of superhydrophobic material surfaces. The surfaces can increase the service life of various components through the water-shedding and contamination minimizing properties thereof, while providing functionality to the surface or component. The micropatterning of carbon nanotubes provides a nanostructured surface configuration. Microstructures associated with the surface may be modulated in up to three dimensions on length scales typically less than about 500 nm, or less than about 200 nm or about 100 nm. The growth of the carbon nanotubes can be controlled to produce various sizes and shapes of the smaller and larger nodes of nano-sized and/or micro-sized structures to develop the desired surface topology on the metallic substrate for a particular application. In an alternate configuration, mesh like carbon nanotubes/fibers may be formed on the surface of the substrate, and are also found to show superhydrophobicity due to high roughness of the surface. The formation of disordered carbon nanotubes/fibers provides super hydrophobicity, and particular surface morphologies may be somewhat different while providing the desired hydrophobic characteristics. For example, a manufacturing method may be implemented for small or large-scale conditions, such that the at least one surface configuration may be realized in a cost effective manner, in accordance with embodiments. In an example as mentioned, the metal substrate is processed to form micropatterning on at least one surface, with this provided using a method for modifying the surface of the substrate in a desired and repeatable manner. In an example, a method according to the invention may include preparation of a steel substrate, such as a stainless steel sample. For example, different grades of stainless steel were used in experimentation and testing, such as stainless steel 304 and stainless steel 316. Different stainless steel samples were cut into a predetermined shape and size. Various substrate configurations may include a stainless steel tube having carbon nanotubes grown on the surfaces as in FIG. 2A, or rings (FIG. 2B), plates (FIG. 2C), lengths of tubes (FIGS. 2D and 2E), mesh (FIG. 2F), wire (FIG. 2G) or other geometries as may be desired. The samples were then cleaned in soap water to remove all the oil or other contaminants from the surface.

At least one surface of the substrates were then treated by an etching of surface. Different etching processes may be used. For example, etching allows the removal of or dissolving away of the passive oxide layers from the substrate surface to enhance growth of carbon nanotubes thereon. Etching also suitably roughen the surface of steel by creating pits of different sizes.

The method can include acid etching of the surface, for instance, wherein the surface is exposed to an acid bath at a predetermined temperature. In an example, the processing can include treatment with an acid, such as $H_2SO_4$, at a predetermined temperature for a predetermined time. In an example, the method of acid etching may be used, wherein typical conditions for etching is in 9M $H_2SO_4$ at 60° C.-95° C. for 5-10 minutes. Alternatively, or in addition, the surface may have a suitable material grafted upon it to provide desired micropatterning. For some metallic substrates on which growth of nanoparticles may not be supported for example, it would be possible to provide a metal catalyst layer on the surface, on which the nanotubes are then grown. The micropatterning of structures on the substrate surface is designed to increase the surface roughness of the substrate.

Figure 3:
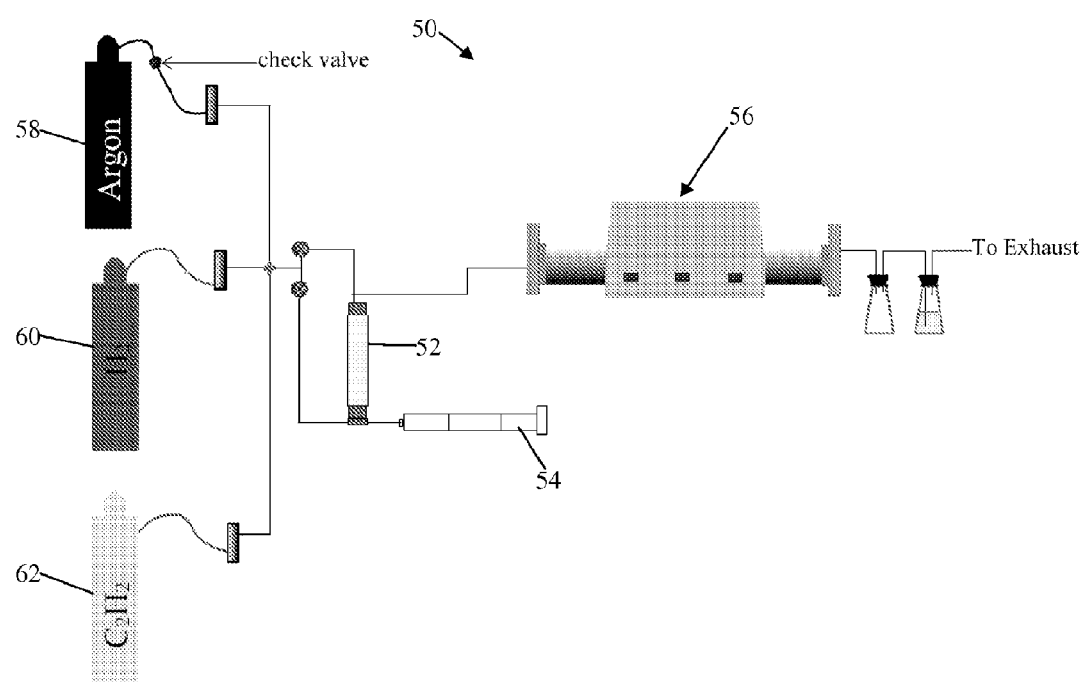
FIG. 3 shows a schematic view of a carbon nanotubes furnace usable to form the materials according to the invention.

Thereafter, the carbon nanotubes/fiber structures can be grown on the treated substrate by suitable techniques. For example, two different chemical vapor deposition processes may be used to grow carbon nanotubes on the metallic substrates. With reference to FIG. 3, a first method, the floating catalyst method, is described which uses ferrocene as catalyst and xylene as carbon source. For example, a carbon nanotubes furnace is shown in the arrangement 50 of FIG. 3, wherein a source of the catalyst and carbon source are provided at 54. As an example, 1 gm ferrocene in 100 ml xylene solution was prepared. The growth was carried out at different temperatures from 600° C. to 800° C. in the furnace 56. By selectively varying the temperature, different thicknesses of carbon nanotubes and varying structures can be produced. As an example, the temperature of growth was 700° C. to produce examples as shown herein. The substrate was heated in Argon-Hydrogen atmosphere (85:15::v:v), provided by the argon sources 58 and hydrogen source 60. The xylene-ferrocene solution was sublimed at 190° C. in chamber 52 and introduced in the furnace 56 in vapor form. In an example of this method, the reaction was carried out for about 40 min-1 hour, though the reaction time can be varied depending on the density of carbon nanotubes/fiber mat to be grown on the surface of the substrate. In a second alternative method, no external catalyst was used. Iron present in steel acted as catalyst for the process. The substrate was heated in argon atmosphere provided from source 58 at about 600° C. for example. It was followed by injection of hydrogen from source 60 to reduce the iron. Hydrogen flow rate was then stopped and acetylene was introduced from source 62 in the furnace 56 for time period of about 30 min-1 hour depending on the density and thickness of carbon nanotubes/fiber mat desired on the surface of the metallic substrate. Other suitable techniques of forming the carbon nanotubes/fibers on the surface may be used.

Upon growing the carbon nanotubes/fibers on the surface, there is thus formed an outer (or inner) surface configuration having a roughness which results in the hydrophobic and superhydrophobic characteristics desired. Also, due to the treatment of the surface, the growth of the nanotubes is affected by the surface characteristics, with different growth occurring over the surface due to the micropatterning formed on the surface. This in turn creates a desired roughness producing the Lotus effect and producing the hydrophobic and superhydrophobic characteristics.

Figure 4A:
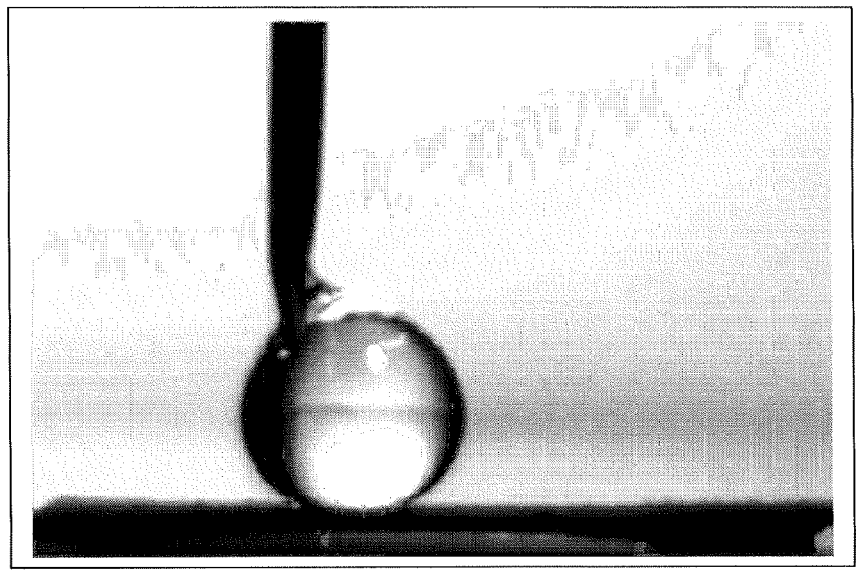
FIG. 4A is a pictorial view of a water drop on a hydrophobic material formed according to the invention showing the water contact angle with the surface.
Figure 4B:
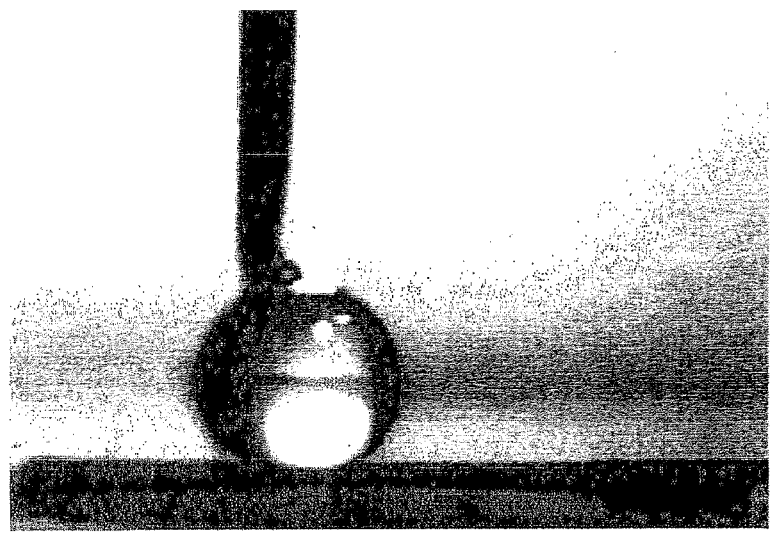
FIG. 4B is a pictorial view of a water drop on a hydrophobic material formed according to the invention showing the receding water contact angle with the surface.

The combination of the increased surface roughness and the increased hydrophobicity of the surface can be controlled to provide a superhydrophobic surface which produces a water contact angle and a water receding angle of greater than about 150°, as seen in FIGS. 4A and 4B. In FIG. 4A, the advancing water contact angle is shown while in FIG. 4B the receding water contact angle is shown, each on a metal surface formed in the manner of the invention, with a 10 μL deionized water droplet for measurement, placed on the surface using a microlitre syringe for example. The water droplet forms a large contact angle with low contact angle hysteresis. As shown, water drops bead up on the superhydrophobic surface such that they have nearly spherical shapes thereon, with a water contact angle of greater than 170° noted in actual examples. Such a surface is also self-cleaning, as water rolling off the surface removes any contamination on the surface. In certain embodiments the shape and size of the nanostructures formed on the metallic substrate can be particularly designed, such as using masking techniques, with the growth of the carbon nanotubes at particular regions or locations on the surface. This may allow formation of a particular flow pattern of liquid on the substrate for example. Alternatively, the structures can have a predetermined aspect ratio, to form a pattern of surface roughness describing lines, channels or other features across the surface, which in turn can control movement of liquid through and/or over the surface.

Figure 5A:
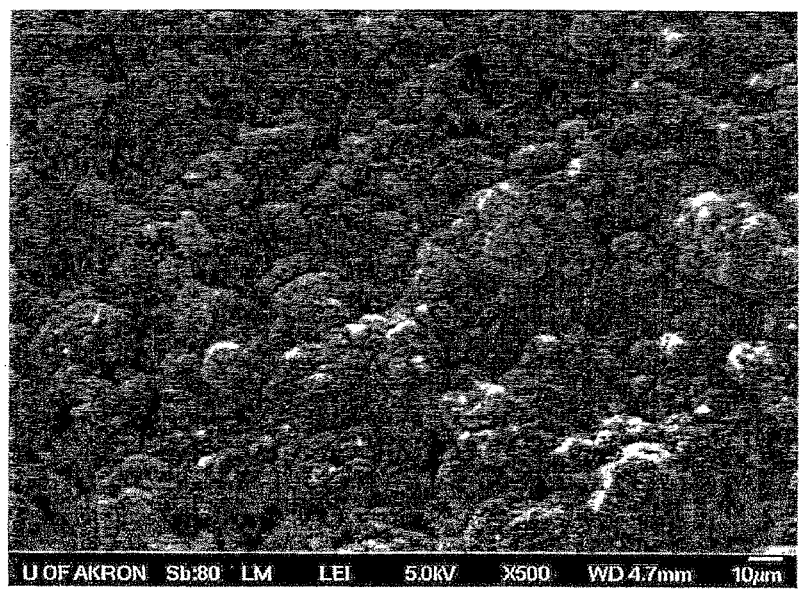
FIG. 5A is a SEM view of a metallic substrate having the carbon nanotube structures formed thereon to provide a hydrophobic surface according to the invention.
Figure 5B:
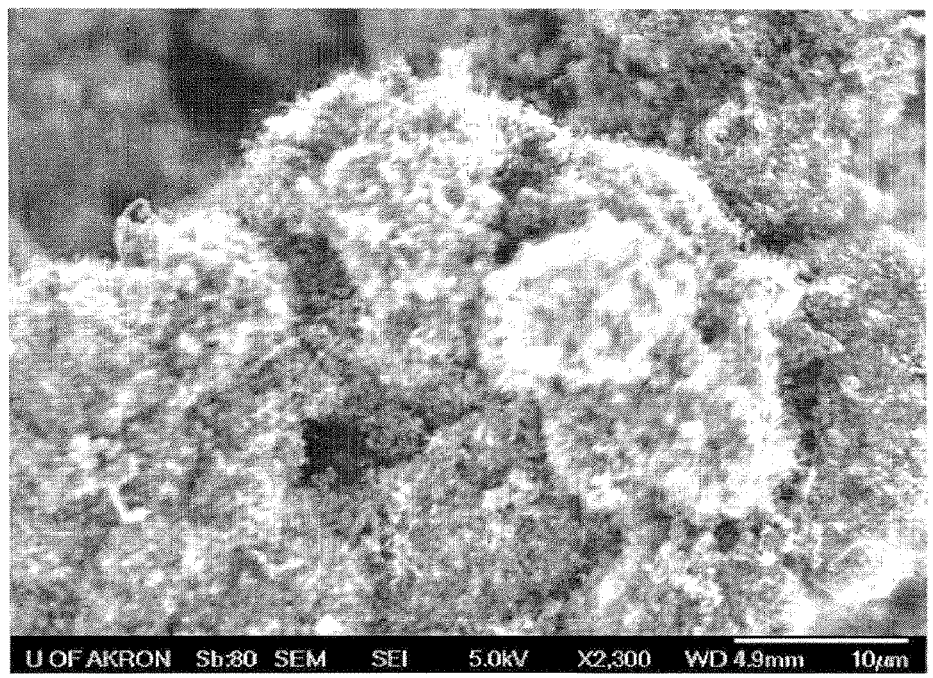
FIG. 5B is a higher magnification SEM view of the modified hydrophobic material of FIG. 5A.
Figure 6:
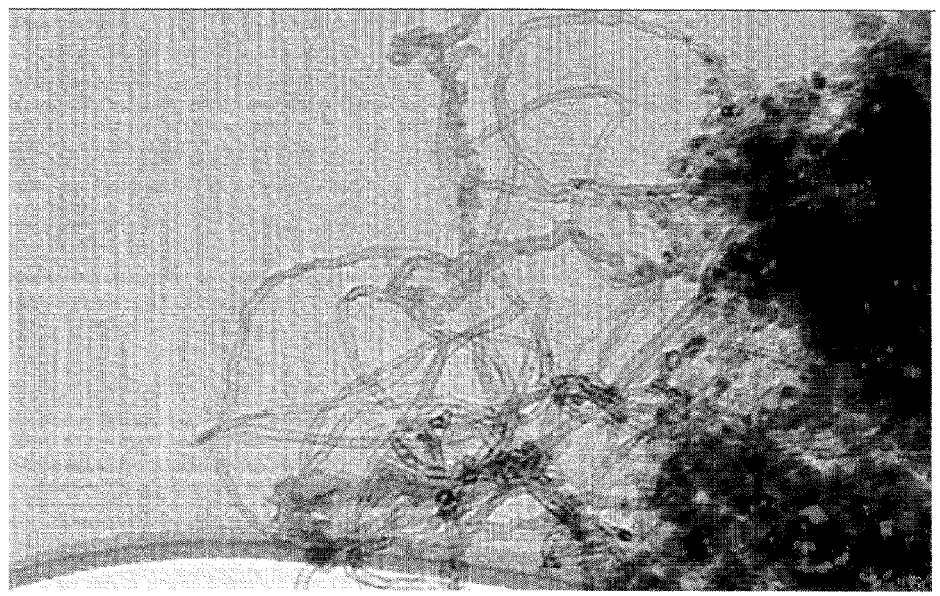
FIG. 6 is a TEM view of the structure, showing that the basic building blocks of lotus like structures are carbon nanotubes.

In an example, a miniature floating structure was formed using a metallic substrate. The surfaces of stainless steel (SS304) plate were modified according to the invention, by growing lotus like structures of carbon nanotubes on its surface. The plate was used to measure the water contact angles as shown in FIGS. 4A and 4B for example, producing a water contact angle greater than 170° and found to have extremely high hydrophobic stability. A square plate (1 cm×1 cm×0.01 cm) of this surface modified steel was found to take 0.5 gm force before actually penetrating the surface of water. This is 40 times higher than the volume of the object. The ability of these surface modified steel plates to hold such high load per unit length allows even square plates to hold high loads, providing the opportunity to engineer much smaller structures which would float on water. The carbon nanotubes may be grown by a chemical vapor deposition process as described as an example, and FIG. 5A shows a first SEM image of the surface of the stainless steel plate with the carbon nanotubes grown thereon and showing lotus like carbon nanotubes structures. FIG. 5B shows a higher magnification SEM image showing the lotus like carbon nanotubes structures formed by the carbon nanotubes. FIG. 6 shows a TEM image of the structure, showing that the basic building blocks of lotus like structures are carbon nanotubes with diameter of around 20 nm. It has been shown that lotus leaves have two dimensional roughness on their surface which makes their surface highly hydrophobic. The carbon nanotube structures formed according to the invention have even higher roughness, because the basic building block is a 20 nm carbon nanotube, which forms small nodes. These small nodes then form larger nodes of different sizes and shapes. Unlike other carbon nanotube structures, this lotus like structure has very high roughness and compactness. As a result, the surface formed is not only superhydrophobic, but it also has very high hydrophobic stability. The heirarchial structure of the small and larger nodes make the structures superhydrophobic. The micropatterning of the carbon nanotubes structures provides nanotubes patterns which also have the characteristic of being self-cleaning.

In examples, different types of steel may be used as the substrate material. Stainless steel 304: Grade 304 is the standard "18/8" stainless. It is the most versatile and most widely used stainless steel, available in a wider range of products, forms and finishes than many other steel materials. It has excellent forming and welding characteristics. The balanced austenitic structure of Grade 304 enables it to be severely deep drawn without intermediate annealing, which has made this grade dominant in the manufacture of drawn stainless parts. Stainless steel 316 is the standard molybdenum-bearing grade, second in importance to Grade 304 amongst the austenitic stainless steels. The molybdenum gives Grade 316 better overall corrosion resistant properties than Grade 304, particularly higher resistance to pitting and crevice corrosion in chloride environments.

Figure 5C:
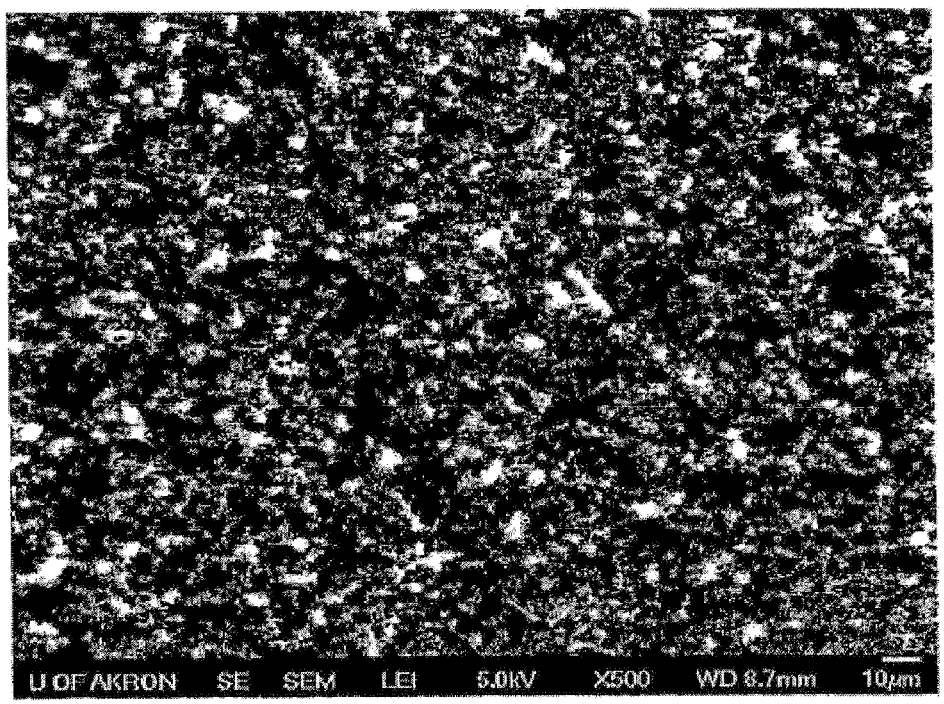
FIG. 5C is a SEM view of a metallic substrate having an alternate configuration of the carbon nanotube structures formed thereon to provide a hydrophobic surface according to the invention.

The surface treatment of these or other metallic materials may include the following. Stainless steel surfaces may have a layer of chromium oxide on them. This chromium oxide is passive substance and can cause catalyst poisoning. In presence of strong acid like $H_2SO_4$ at room temperature this chromium oxide layer dissolves away thus helping in better growth of carbon nanotubes on the steel surface. The steel materials may be treated at higher temperatures (>80° C.) in such an acid to form a surface which is very rough. This highly roughened surface assists in growing different morphologies of carbon nanotubes. In examples, the roughness of the resulting carbon nanotubes structures can be controlled via the processing of the steel materials before growing the carbon nanotubes thereon. The following temperature ranges represent examples to control carbon nanotube growth. For producing lotus like structures such as shown in FIG. 5A, acid treatment (9M $H_2SO_4$) for 10 minutes at about 95° C. was performed. At a lower temperature processing, such as between 40-60° C., a mesh of nanotubes structures is formed as shown in FIG. 5C. Though each of the surfaces formed in these examples was superhydrophobic, the nature of the surfaces may be suitable for varying applications, depending on the exposed surface area of the carbon nanotubes structures.

Figure 7D:
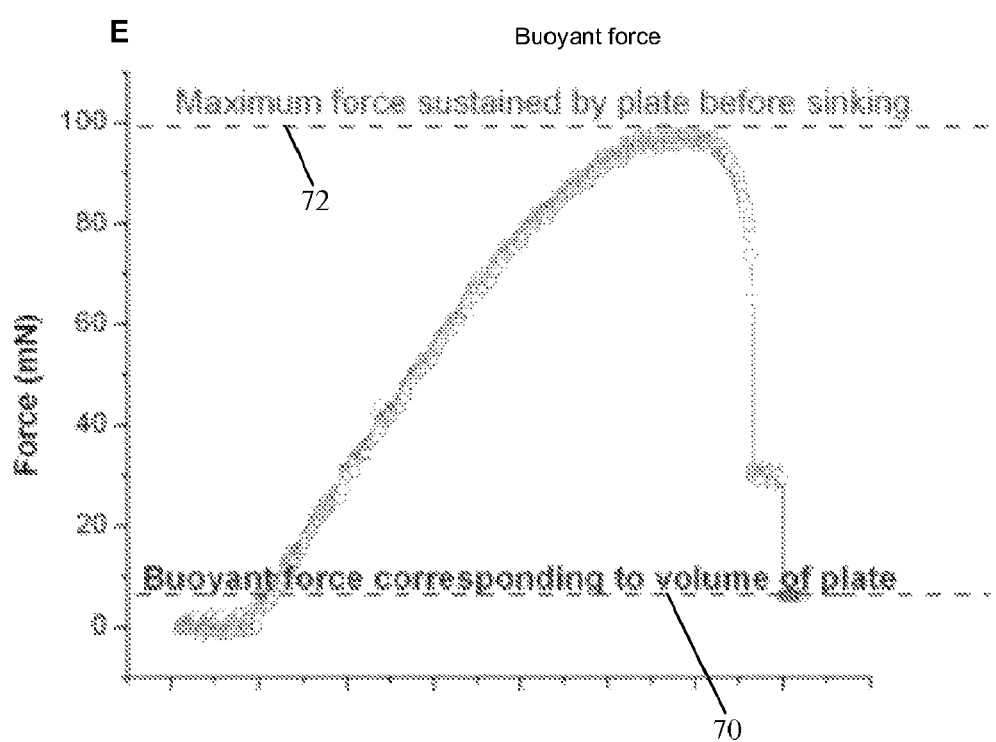
FIG. 7D shows a graph of maximum force of a modified steel plate such as shown in FIG. 7C compared to buoyant force corresponding to water displacement equivalent to volume of the plate.

The hydrophobic characteristics of the formed surfaces were also shown by other tests. Scanning electron microscope (SEM) images of samples made according to the invention were produced along with transmission electron microscope (TEM) images, used to see the structure of individual units. Hydrophobicity was tested by seeing water contact angle on the carbon nanotube surfaces as mentioned above. Environmental stability of the formed coatings were tested by testing four parameters: (a) Stability at extremely low temperatures (Liquid $N_2$); (b) Stability at high temperature (heating in air at temperatures up to 400° C.); (c) Stability in boiling water; and (d) Stability to quench (plates were boiled in water then immediately transferred in an ice bath). After each of these environmental tests, SEM images of the surface of carbon nanotubes was taken to see any change in properties. Water contact angle was also measured to note any change in hydrophobicity after treatment to harsh environments. In FIG. 7A, an optical image of an ice droplet on the surface of steel having the carbon nanotubes coating formed thereon is shown. When cooled to sub zero temperature, keeping air temperature at room temperature, the carbon nanotube surface retards ice formation as compared to more hydrophilic surfaces, showing their potential for use in cryogenic devices and applications. In FIG. 7B, a SEM image of carbon nanotube surface after boiling in water and quenching in ice. The image shows that the structure remains intact and there is no delamination. Inset in FIG. 7B is an optical image taken on Rame Hart goniometer. It shows that the surface is still superhydrophobic after harsh treatment. In FIG. 7C, an optical image shows maximum water displaced by carbon nanotube modified steel plates before they sink in water. FIG. 7D shows the maximum force that a steel plate can take as compared to buoyant force corresponding to water displacement equivalent to volume of the plate. The Y-axis measures force in mN as the plate is pushed in water. The bottom line 70 corresponds to density of water multiplied by volume of the plate. The top line 72 shows actual force supported by plate before sinking. In FIG. 7E, there is shown an optical image of 0.5 mm thick stainless steel plate having the carbon nanotubes surface configuration formed thereon and floating on the water surface.

Figure 8A:
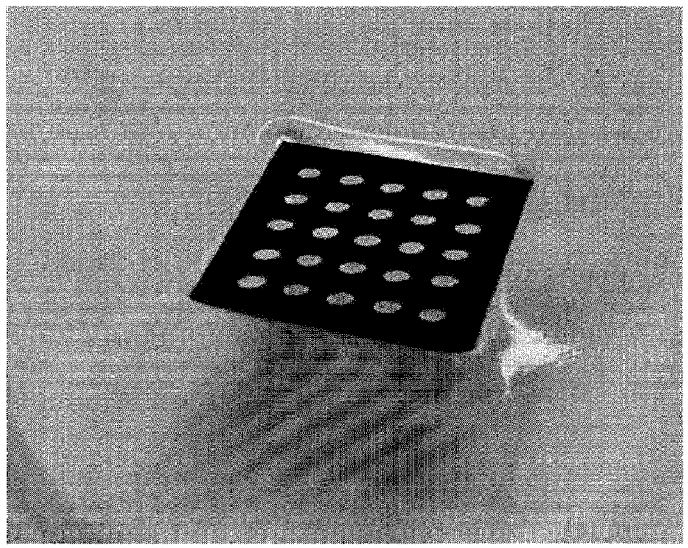
FIG. 8A shows a top view of a floating steel plate according to an example of the invention.
Figure 8B:
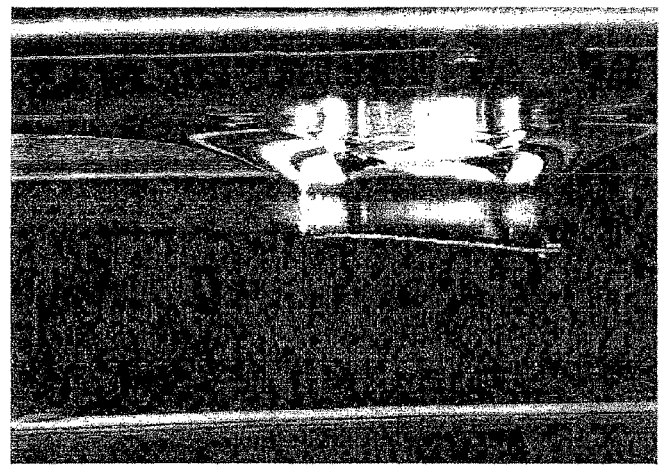
FIG. 8B shows an underwater view of the plate shown in FIG. 8A displaced into the water.

In this example, the mechanism of this ability to hold such high loads by a floating steel plate can be visualized by monitoring how this plate actually bends the water surface like an elastic sheet on increasing load. The surface of this material is so water repellent that the surface of water stretches, such that there is a dimple of 5 mm on the water surface before it actually overcomes the surface tension and the plate sinks. An example of this is shown in FIGS. 8A and 8B, wherein a 2 cm×2 cm×0.01 cm plate is provided with a plurality of holes formed thereon to increase the surface area of its perimeter and reduce its weight. The surface of the plate are provided with the carbon nanotube structures as described, and the plate floats on the surface of water due to the hydrophobic nature of the surfaces. A side view of the plate is shown in FIG. 8B as it is pushed into the water by a load applied to its top side, indicating it can carry significant load while stretching the water surface. Being superhydrophobic, this material resists penetration in water surface. On putting more and more load, water surface deforms.

Figure 9:
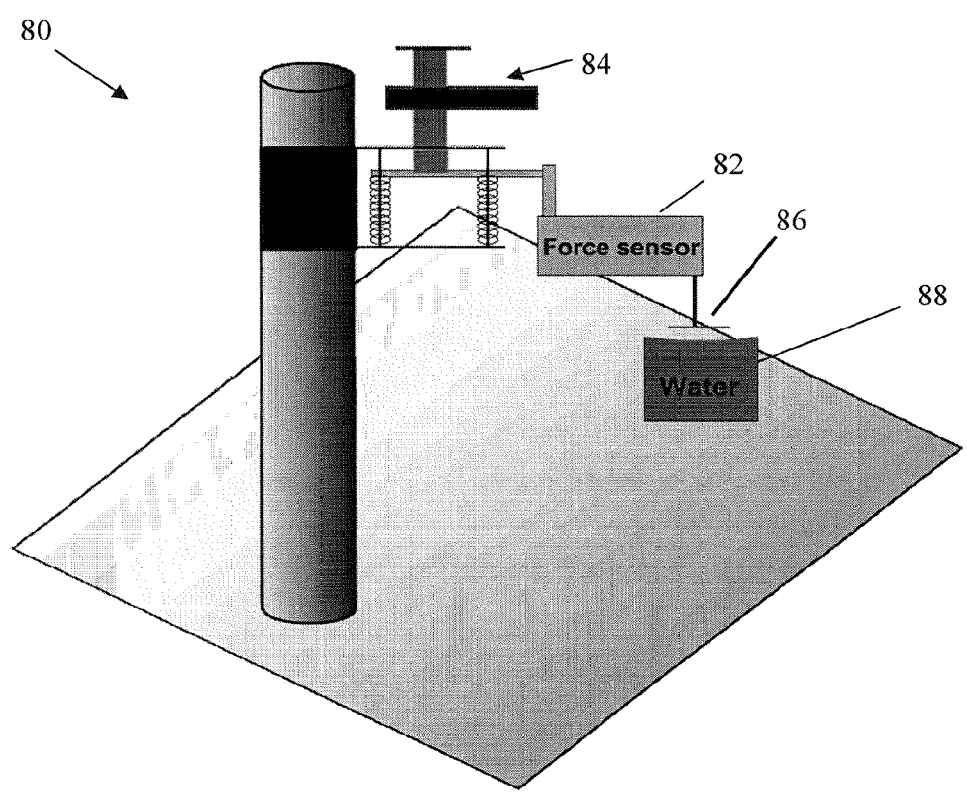
FIG. 9 shows a schematic view of a test arrangement for measuring force that a metal plate can hold before sinking in water.
Figure 10:
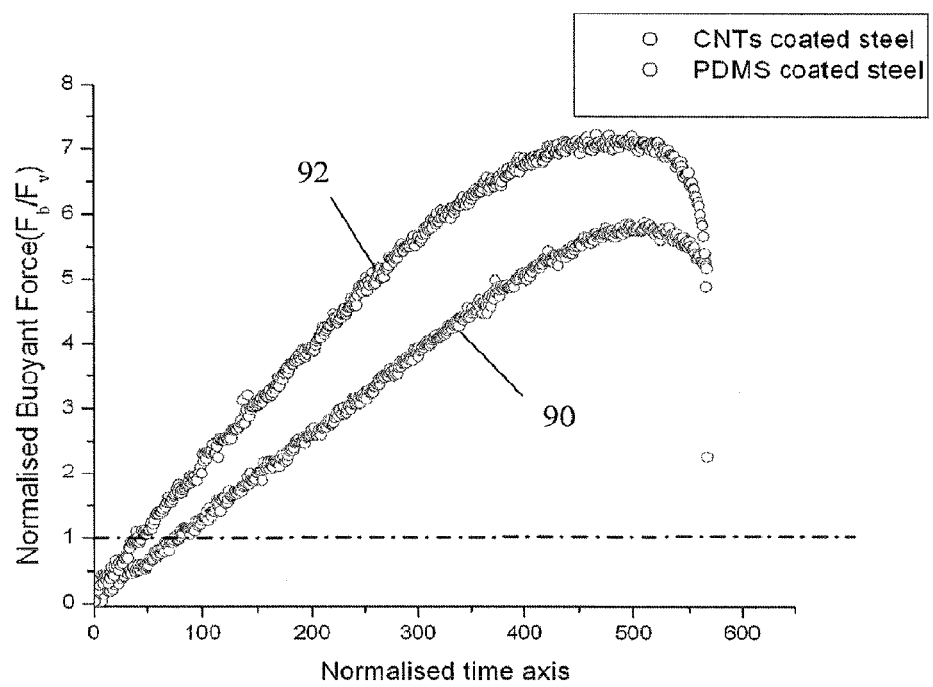
FIG. 10 shows a graph of normalized buoyant force vs. normalized time for a steel plate having a surface configuration according to the invention and a PDMS coated steel plate.

The amount of water displaced is much greater than just the volume of steel plate. Not only can this material hold higher weights, but being non-wetting, they can form the basis of different kinds of locomotion on the water surface. There is little or no capillary pull down when this material is pulled away from water surface. This may allow for the creation of water walking robots or structures which can be moved and manipulated on the water surface. To measure the force that the sample plates can hold before sinking, a load sensor arrangement 80 was used as shown in FIG. 9. A load or force sensor 82 was mounted on a motorized stand 84 which could move down and push the plate 86 inside water 88. The maximum force a stainless steel plate coated with these carbon nanotube coatings was compared to another coating with a low surface energy poly (dimethyl siloxane), with the results shown in FIG. 10. In FIG. 10, the results for the normalized buoyant force for a PDMS coated steel plate is shown at 90, and the results for a carbon nanotube coated steel plate are shown at 92. Unlike buoyant force which depends solely on the volume of object, the materials according to the invention displace water depending on their perimeter and hydrophobicity. Thus, the weight of plates in these examples can be reduced by reducing the thickness of material. This may then allow putting more payload on the plates. To further reduce the mass of plates, square stainless steel plates of same side length but with holes punched in center were tested for maximum force they can take. It was found that by providing holes in the plates, the mass was reduced along with an increase in the maximum force that a plate can hold. This is due to the upward surface tension forces depending on the perimeter of the material. By punching holes in the plates, there was an increase in the surface tension forces acting on the plates.

Due to high strength and chemical resistance stainless steel is an attractive choice of material for many other applications. The invention is also directed to the metallic surface modified substrates that can be formed according to the disclosed processes for use in other applications. In particular, the surface modified metallic substrates can include at least one surface having the carbon nanotubes/fibers structures formed thereon to provide hydrophobic characteristics. The surface may be the metallic material itself, with the carbon nanotubes grown directly thereon, or a metallic surface modified with a catalyst layer for indirectly growing the carbon nanotubes thereon. The structures include the formation of small nodes formed of the carbon nanotubes and also the formation of larger nodes of different sizes and shapes, as shown in FIGS. 3A and 3B. The formed carbon nanotube structures have very high roughness and compactness, and can be formed over large surface areas.

Figure 11:
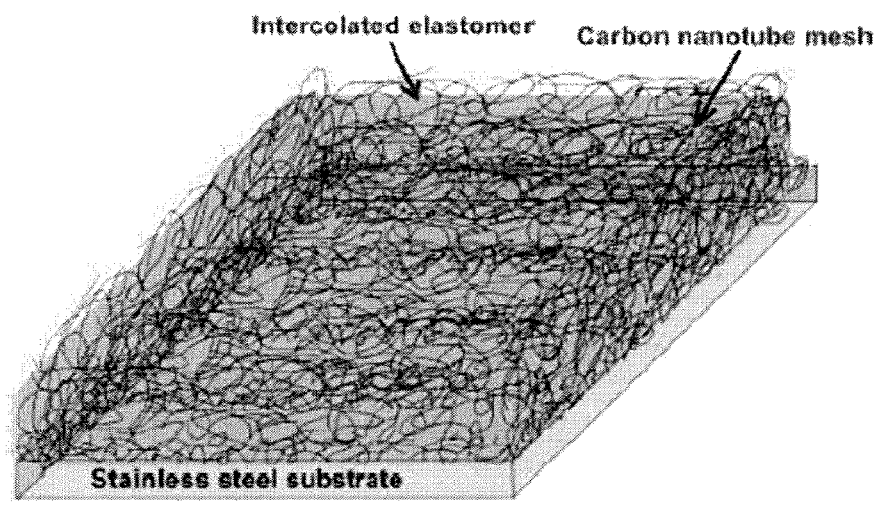
FIG. 11 shows a schematic view of a polymer reinforced coating according to an embodiment of the invention.
Figure 12A:
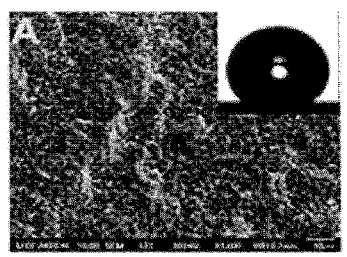
FIG. 12A shows a SEM image of a polymer reinforced coating according to an example, and inset the hydrophobic characteristics thereof.
Figure 12B:
FIGS. 12B and 12C show optical images of a tape test on a non-reinforced and a polymer reinforced example of a coating according to an example of the invention.
Figure 12C:
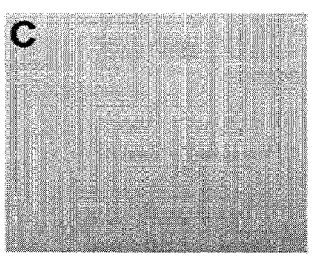

The structures that may be formed using metals or materials with metallic surface coatings are wide ranging, and the addition of one or more hydrophobic surfaces thereto may provide significant benefits for many applications. In alternate examples, the surface configurations according to the invention may also be formed to have other desirable characteristics and/or attributes. For example, the carbon nanotubes/fibers coatings on metals may further be reinforced or/and functionalized by infiltration of suitable compound in the structure. As a more specific example, PDMS prepolymer (sylgard 184) was dissolved in xylene (1 gm sylgard in 10 ml xylene) to make dilute solution. This solution was then spin coated on the carbon nanotube modified steel surfaces. The concentration of polymer solution may be such that it intercalates the carbon nanotube mesh but doesn't form a mesh on the surface of carbon nanotubes/fibers. Then the whole system was crosslinked at 70° C. The PDMS chains infiltrated inside the carbon nanotube mesh and reinforced the whole structure whilst retaining the surface roughness of material. The material showed superhydrophobic effect but in addition now the coating became highly scratch resistant. A test similar to ASTM D3359-02 to test the fastness of a coating on metal substrate was performed. It was seen that after infiltration with PDMS the coating became much more durable. Other reinforcement techniques, such as creating the carbon nanotubes/fibers coating with either a thermoplastic or thermoset may create a stronger coating than that without the carbon nanotubes/fibers. This kind of structure gave the coating extremely high scratch resistance in addition to its high environmental stability. Different polymers can be used depending on the requirement for specific application. An example of such a structure is shown in FIG. 11, which schematically shows a carbon nanotube mesh formed on the surface of a stainless steel substrate, and having an intercolated elastomer reinforcement therewith. As seen in FIG. 12A, such an elastomer reinforced carbon nanotubes mesh is shown in a SEM image, wherein a carbon nanotubes mesh was reinforced with a poly(dimethyl siloxane), with the inset showing the superhydrophobic characteristics maintained therewith. In FIGS. 12B and 12C, optical images are shown for a tape test on a carbon nanotube surface without the polymer reinforcement and with reinforcement respectively, indicating that the non-reinforced surface configuration can leave some carbon nanotube residue on an adhesive tape, while the polymer reinforced surface does not leave any such residue.

Similarly the coatings can further be functionalized by using similar processes or processes like plasma polymerization wherein thin layer of suitable polymeric material can be deposited on the carbon coatings. As a more specific example, a fluoro compound may be deposited using process like plasma polymerization or a similar process, it can induce lyophobic behavior of the whole structure in addition to its superhydrophobicity.

The present invention may be applied in heat transfer equipment for example, aeronautical applications, nautical applications, vehicle applications, medical applications, and commercial and residential applications. Also, a variety of other embodiments are contemplated having different combinations of the below described features of the present invention, having features other than those described herein, or even lacking one or more of those features. As such, it is understood that the invention can be carried out in various other suitable modes.

Figure 13:
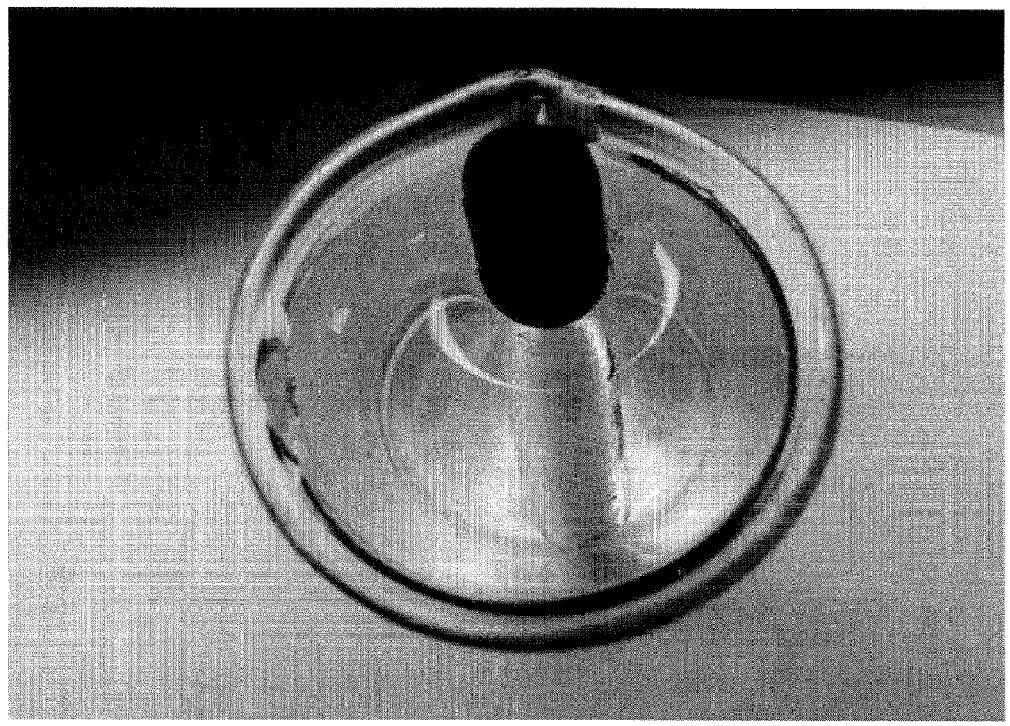
FIG. 13 shows a metal tube coated with the carbon nanotube structure according to an example of the invention, with the tube then submerged in water.

In heat transfer equipment for example, such as heat transfer furnaces, steam may condense on metal pipes. This condensed layer of water on metal acts as an insulating layer thus reducing the heat transfer efficiency. Organic hydrophobic materials may not be a suitable choice for use in such applications because they themselves are thermally insulating. Carbon nanotubes on the other hand have a very high thermal conductivity. Coating of carbon nanotubes on metal furnaces would help in increasing heat transfer efficiency. In use with solar panels, carbon nanotubes have high thermal absorption coefficient. If coated on metal surfaces of solar heaters, these materials can absorb solar radiations much more efficiently and transfer heat to metal substrates. Unlike black paints used on metal surfaces the carbon nanotube material has high thermal conductivity, and thus can increase efficiency. In fluid mechanics applications, using the process of growing carbon nanotubes on metals allows coating not only outside surfaces but also the inside surfaces of pipes. This can form superhydrophobic surfaces on the interior of the pipes, such that water flowing through these pipes will have minimum interaction with the surface of pipes. Due to reduced friction, lesser energy would be required to pump water through these pipes. In nautical applications, the non-wetting and non-fouling characteristics of the hydrophobic surfaces formed according to the invention may also be very useful. Ship hulls having such outer surfaces would reduce friction with the water to increase fuel efficiency and facilitate preventing fouling of the water engaging surfaces by organisms. The modified steel surfaces for example are non-wetting and remain dry. This could make these surfaces non-fouling. Further, such materials can be used for making medical instruments that can be more easily cleaned and sanitized. In FIG. 13 for example, a metal tube is coated with the carbon nanotubes structure, with the tube then submerged in water. The tube appears silvery due to the trapped air layer on the surface of the tube. The interior of the tube may also be formed with the carbon nanotubes structures, and may be useful in medical applications including catheters, vascular stents or other medical applications.

The materials may also be useful in other applications, such as in the coating of tire chords. Steel chords are used to reinforce tires, but steel itself has a low adhesion with rubber. Carbon nanotube coated steel can provide an alternate option for steel reinforced tires, to provide better adhesion between the rubber materials and the cords, at various temperatures for example. Similarly, reinforcing metal materials in concrete or other materials may be enhanced by materials according to the invention.

Due to the thermal conductivity of the metallic substrate materials and the carbon nanotubes structures, cryogenic applications are also contemplated. If the surface of a material is relatively much colder than the surrounding, water vapor may condense on the surface of the material causing a buildup of snow or ice on those surfaces. Use of the superhydrophobic surfaces according to the invention may provide the material with the characteristic to keep the surface dry, and therefore reduce buildup of ice on surface. Such applications may include aeronautical uses for example. The thermal conductivity characteristics may also be useful in preventing the corrosion that may occur to metal materials from water at higher temperatures, such as in the storage of hydrocarbons or oil underground where some water is present. As the hydrophobic surfaces of the invention will protect the underlying metallic substrate and be able to withstand higher temperature environments, such a surface configuration can be very useful.

In other applications, due to the electrical characteristics of the carbon nanotubes, the surfaces may be used as anti-static surfaces which dissipate or prevent the accumulation of static electricity charges, such as in electronics or aerospace applications. Providing a surface that is both superhydrophobic and anti-static may be useful for a variety of environments and applications. Also, due to the significantly increased surface area on the surface as produced by the carbon nanotubes microstructures, the surfaces may be useful in other electronics applications such as to form electrodes for example.

As should be recognized, the hydrophobic surfaces according to the invention, in conjunction with a metal or metallic coated substrate, can be used in a wide range of applications. In addition to the above, the superhydrophobic surfaces of the current invention are usable whenever a superhydrophobic surface is desired. It will be appreciated, therefore, that specific uses/methods/applications/etc. claimed or described herein are illustrative, but not limiting. The superhydrophobic substrates of the invention can optionally be employed in containers (e.g., for pharmaceuticals or other costly liquids) where volume loss or retention is of concern. Drug delivery devices can be constructed which have superhydrophobic surfaces of the invention. Such drug delivery devices could help ensure that a full proper dosage of drug is delivery each application. Also, various devices (e.g., capillaries and/or microfluidic devices) which have small volumes also may be provided with superhydrophobic substrates of the invention in order to prevent or reduce fluid retention, drag or the like.

The ability of the superhydrophobic substrate surfaces of the invention to easily shed water or other liquids off the surface can be useful for any application where reduction of drag or fluid friction is desired. Additionally, the self-cleaning characteristics of the surfaces can be used in other environments, such as for cleaning of other surfaces to remove contaminants and then allow them to be easily cleaned therefrom. Other applications of the invention can comprise use in cooking implements, e.g., pots, pans, cooking vessels, etc. to prevent sticking of foodstuffs and to allow easier cleaning of such vessels. Those of skill in the art will be quite familiar with similar applications based upon anti-stick coatings of current cookware. In applications to prevent/reduce water, snow or ice accumulation on structures, it is also possible to heat the structures to allow liquid to easily be shed.

The superhydrophobic surfaces may also be used in building materials, such as roofing materials, siding, gutters, etc. to help prevent/reduce ice and snow accumulation, and maintain the integrity of the materials and structures. Similar applications can also provide anti-fouling surfaces that prevent mold or mildew formation in humid areas. Yet another optionally use of the current invention involves production of non-fouling water heaters, boilers or heat exchangers. Heat exchangers that comprise liquids, work very efficiently when local boiling occurs at imperfections on the exchanger wall. The heat of evaporation is typically much larger than the heat capacity of the liquid. Once a bubble grows large enough, it separates form the surface and transfers the heat into the bulk of the working fluid. A superhydrophobic surface according to the invention facilitates local boiling of water, and prevents fouling of the surfaces of such equipment.

The surfaces produced according to the invention may be used on at least one surface of a component part, wherein "component" refers to one of the individual parts of a composite product. A component may refer to a part that can be separated from or attached to a system, a part of a system or assembly, or other part known in the art. In addition, the term "surface" refers to the outer boundary layer of a material, component or product. The invention also relates to products and methods for producing a product having a superhydrophobic surface physical property. The product comprises a metallic materials substrate, and generating predetermined roughness of the outer surface of the substrate. At least one layer of carbon nanotubes/fibers microstructures having nanometric-size dimensions is formed on the outer surface of the substrate, the at least one layer having at least a two dimensional micropattern formed from the carbon nanotubes, whereby the nature of the surface configuration produces the desired superhydrophobic characteristics. Water has been taken here as an example, but the product covered by the invention may also react similarly with other fluids.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention. Modifications and alterations will occur to others upon a reading and understanding of this specification. It is intended to include all such modifications and alterations insofar as they come within the scope of the appended claims or the equivalents thereof.

What is claimed is:

1. A surface with a hydrophobic microstructure, comprising:
   a metal substrate comprising a metal selected from the group consisting of stainless steel, iron, brass, bronze, duraluminum, chromium, stainless steel 304, stainless steel 316, and combinations thereof having a carbon nanotube/fiber mesh grown thereon, with the carbon nanotube/fiber mesh having a hierarchial structure, said hierarchial structure formed of small nodes and large nodes of a plurality of carbon nanotubes/fibers, the small and large nodes forming microstructures and formed to have a predetermined roughness in association with the surface; and
   a chemical compound infiltrated into said heirarchial structure of said carbon nanotube/fiber mesh.

2. The surface of claim 1, wherein said hierarchical structure is modulated in three dimensions on length scales of 500 nm or less.

3. The surface of claim 1, wherein the surface is superhydrophobic.

4. The surface of claim 1 having a water contact angle greater than 150°.

5. The surface of claim 1, wherein the surface of said metal substrate is modified by a process selected from the group consisting of etching, grafting of at least one material onto the surface, and combinations thereof.

6. The surface of claim 1, wherein the surface of said metal substrate is modified with a catalyst layer for indirectly growing the carbon nanotubes/fibers thereon.

7. The surface of claim 1, wherein the carbon nanotubes/fibers of said carbon nanotube/fiber mesh are selectively functionalized.

8. The surface of claim 1, wherein the carbon nanotubes/fibers of said carbon nanotube/fiber mesh are functionalized by said chemical compound infiltrated into the heirarchial structure and said chemical compound is a polymer.

* * * * *